United States Patent
Aoyama et al.

[11] Patent Number: 5,933,364
[45] Date of Patent: Aug. 3, 1999

[54] SEMICONDUCTOR DEVICE WITH A METAL LAYER FOR SUPPLYING A PREDETERMINED POTENTIAL TO A MEMORY CELL SECTION

[75] Inventors: Yasuhiro Aoyama, Kyoto; Kiyoto Oota; Kazuhiko Shimakawa, both of Osaka, all of Japan

[73] Assignee: Matsushita Electric Industrial Co., Ltd., Osaka, Japan

[21] Appl. No.: 09/237,853

[22] Filed: Jan. 27, 1999

[30] Foreign Application Priority Data

Mar. 23, 1998 [JP] Japan .................................. 10-073813

[51] Int. Cl.⁶ ........................................................ G11C 5/06
[52] U.S. Cl. .................................. 365/63; 365/51; 365/53; 365/228; 257/659; 257/660
[58] Field of Search .................. 365/63, 228, 51, 365/53; 257/659, 660

[56] References Cited

U.S. PATENT DOCUMENTS

| 4,494,217 | 1/1985 | Suzuki et al. .......................... 365/53 |
| 4,953,002 | 8/1990 | Nelson et al. ........................ 257/659 |
| 5,161,124 | 11/1992 | Love ...................................... 365/222 |
| 5,375,095 | 12/1994 | Yamada et al. .................. 365/230.03 |
| 5,475,643 | 12/1995 | Ohta ...................................... 365/206 |

FOREIGN PATENT DOCUMENTS

| 56-100463 | 8/1981 | Japan .............................. G11C 11/34 |
| 4-212454 | 8/1992 | Japan ............................ G11C 11/405 |

Primary Examiner—Andrew Q. Tran
Attorney, Agent, or Firm—Sixbey, Friedman, Leedom & Ferguson, PC; Eric J. Robinson

[57] ABSTRACT

A semiconductor device according to the present invention includes: a semiconductor chip; and memory and logic sections formed on the semiconductor chip. The memory section includes: an array of memory cells; a sense amplifier circuit; and memory interconnects respectively provided in a number n (where n is a positive integer) of interconnect layers. The logic section includes logic circuits having logic interconnects respectively provided in a number n+m (where m is a positive integer) of interconnect layers. A metal layer is formed in one of (n+1)th to (n+m)th interconnect layers, covers the array of memory cells and supplies a predetermined potential to the memory section.

7 Claims, 11 Drawing Sheets

SEMICONDUCTOR DEVICE WITH A METAL LAYER FOR SUPPLYING A PREDETERMINED POTENTIAL TO A MEMORY CELL SECTION

BACKGROUND OF THE INVENTION

The present invention relates to a semiconductor device in which memory and logic circuits are formed on a single semiconductor chip.

In a semiconductor device in which memories such as DRAM's are integrated on a semiconductor chip, a larger number of sense amplifier circuits, placed adjacent to an array of memory cells, are activated simultaneously during a read or write operation. Accordingly, large instantaneous current flows through peripheral circuits for the sense amplifier circuits or sense amplifier driver circuits driving these sense amplifier circuits, and the ground level of the array of memory cells varies. As a result, the access time possibly increases.

In order to prevent such an increase in access time and stabilize the operation of memories, various measures have heretofore been taken. For example, the contact of the peripheral circuits for the sense amplifier circuits with a ground is stabilized. The energy of alpha rays is attenuated by coating an array of memory cells with a silicone resin or the like. or an error correction circuit is introduced into an array of memory cells.

In recent years, a semiconductor device, in which large-capacity memory circuits such as DRAM's (hereinafter, referred to as a "memory section" collectively) and custom logic circuits like CPU's and ASIC's (hereinafter, referred to as a "logic section" collectively) are integrated on a single semiconductor chip, has already been implemented.

Accordingly, such a semiconductor device in which memory and logic sections are integrated on a single semiconductor chip poses a new problem that the logic section might be adversely affected in various manners by the memory section.

Firstly, a variation in ground level of the array of memory cells in the memory section might have an unwanted effect on some circuits in the logic section, e.g., circuits performing an analog operation, in particular.

Secondly, such a semiconductor device having memory and logic sections integrated on a single chip is more expensive to manufacture. The reason is as follows: since such a semiconductor device takes on a custom-made nature more often than not, bigger packages are frequently used therefor. Accordingly, when a technique of preventing soft errors by increasing the purity of a package resin or by coating the surface of the chip is employed, higher costs are required for bigger packages.

Thirdly, in accordance with currently available techniques, a freely usable space, existing over the memory section, cannot be fully taken advantage of. Specifically, in a semiconductor device having memory and logic sections integrated on a single semiconductor chip, the memory section occupies about a half of the entire area of the semiconductor chip. Thus, a space where interconnects can be disposed exists over the memory section. However, if interconnects are disposed over the memory section, then memory cells or bit lines might possibly receive noise from the upper-level interconnects. Accordingly, even though such a space where interconnects can be disposed exists over the memory section, the space cannot be utilized effectively. This is because signal lines, which are usually more likely to generate noise, should not constitute an upper-level interconnect layer over the memory section.

Furthermore, although the operating speed of semiconductor devices included in an electronic device has recently been increased in general, electromagnetic wave noise emitted from such an electronic device has tended to increase. Accordingly, a problem of bidirectional electromagnetic interference arises. Specifically, the electromagnetic wave noise, emitted from an electronic device, adversely affects other appliances or parts due to radiation or electromagnetic induction, while the electronic device itself experiences the harmful effects of externally incoming electromagnetic wave noise. Thus, suppressing electromagnetic wave noise and electromagnetic interference as much as possible is a common important problem to be solved for electronic devices of every sort, as well as semiconductor devices having memory and logic sections integrated on a single chip.

SUMMARY OF THE INVENTION

In view of these problems, an object of the present invention is making more effective use of a free space existing over a memory section of a semiconductor device having the memory section and a logic section that are integrated on a single semiconductor chip.

Another object of the present invention is stabilizing a potential supplied to the memory section.

Still another object of the present invention is reducing soft errors generated in the memory section.

In order to accomplish these and other objects, a semiconductor device according to the present invention includes: a semiconductor chip; a memory section, which is formed on the semiconductor chip and includes an array of memory cells, a sense amplifier circuit, and memory interconnects respectively provided in a number n (where n is a positive integer) of interconnect layers; a logic section, which is also formed on the semiconductor chip and includes logic circuits having logic interconnects respectively provided in a number n+m (where m is a positive integer) of interconnect layers; and a metal layer, which is formed in one of (n+1)th to (n+m)th interconnect layers and covers the array of memory cells. The metal layer supplies a predetermined potential to the memory section.

In the semiconductor device of the present invention, the metal layer, supplying a predetermined potential to the memory section, has an area large enough to cover the array of memory cells and therefore has a sufficiently large capacitance. Accordingly, the potential supplied to the memory section is stabilized.

In addition, the energy of alpha rays incoming from the outside of the semiconductor device or from a resin package covering the semiconductor device toward the semiconductor substrate is attenuated by the metal layer. As a result, soft errors are generated in the memory section a considerably smaller number of times.

Moreover, since the metal layer can block an electromagnetic wave, the array of memory cells is less likely to be affected by electromagnetic interference caused by noise generated in an upper-level interconnect layer over the metal layer.

Furthermore, since the metal layer has so large an area as to cover the array of memory cells, the constraint on the position of a contact for supplying a predetermined potential to the memory section can be alleviated. Accordingly, it is no longer necessary to excessively extend the interconnect through which the predetermined potential is supplied. As a result, the contact and interconnect for supplying the predetermined potential can be placed more easily and the level of the predetermined potential supplied to the memory section is stabilized.

In general, the number of memory interconnects provided for the memory section may be smaller than the number of logic interconnects provided for the logic section. Accordingly, the number of interconnect layers where the memory interconnects are formed may also be smaller than the number of interconnect layers where the logic interconnects are formed. Therefore, even if the metal layer is provided in one of the (n+1)th to (n+m)th interconnect layers, the overall number of interconnects layers does not increase. In other words, according to the present invention, the interconnect layers overlying the memory section can be utilized more effectively.

In one embodiment of the present invention, the metal layer preferably covers the array of memory cells and the sense amplifier circuit.

In such an embodiment, since the area and capacitance of the metal layer are even larger, the potential supplied to the memory section is further stabilized. Also, not only the array of memory cells but also the sense amplifier circuit can be protected from alpha rays. As a result, soft errors are generated in the memory section an even smaller number of times. Moreover, the sense amplifier circuit is less likely to be affected by electromagnetic interference caused by noise generated in an upper-level interconnect layer over the metal layer. Furthermore, the metal layer has an area large enough to cover the array of memory cells. Accordingly, the contact and interconnect for supplying the predetermined potential can be placed more easily and the level of the predetermined potential supplied to the memory section is further stabilized.

In another embodiment of the present invention, the metal layer preferably covers the memory section.

In such an embodiment, the potential supplied to the memory section is further stabilized. Also, soft errors are generated in the memory section an even smaller number of times. Moreover, the memory section is less likely to be affected by electromagnetic interference caused by noise generated in an upper-level interconnect layer over the metal layer. Furthermore, the contact and interconnect for supplying the predetermined potential can be placed more easily and the level of the predetermined potential supplied to the memory section is further stabilized.

In still another embodiment of the present invention, the metal layer preferably has an opening.

In such an embodiment, it is possible to reduce an interlevel stress caused between the metal layer and an upper- or lower-level interlevel dielectric film adjacent to the metal layer due to a difference in thermal expansion coefficient therebetween. As a result, the generation of stress migration between adjacent interconnect layers can be suppressed.

In still another embodiment, the memory section is preferably a DRAM.

Although a DRAM is easily out of order by nature due to soft errors caused by alpha rays, the soft errors in the DRAM can be reduced according to the present invention, because the metal layer can attenuate the energy of alpha rays.

In still another embodiment, the metal layer preferably supplies the predetermined potential to a sense amplifier driver circuit for driving the sense amplifier circuit.

In such an embodiment, even when a large number of sense amplifier circuits are activated at the same time during a read or write operation performed on the memory section, the sense amplifier driver circuit can exhibit excellent drivability for the sense amplifier circuits. That is to say, since the potential level in the array of memory cells is less likely to vary, the increase in access time can be prevented.

In still another embodiment, the semiconductor device of the present invention preferably further includes a metal interconnect, which is formed in an interconnect layer overlying the (n+m)th interconnect layer and one terminal of which is connected to a pad. The other terminal of the metal interconnect is preferably connected to at least one of the memory and logic interconnects through a contact.

The metal interconnect connecting the pad to one of the memory and logic interconnects is in a coupling relationship with the memory interconnect. Thus, the memory interconnect is easily susceptible to noise owing to the variation in potential level of the metal interconnect. However, since the metal layer having a large area is interposed between the metal interconnect and the memory interconnect and cuts off the noise, the memory section is affected by the noise to a considerably lesser degree. As a result, the interconnect layer to which the pad is connected can be used effectively.

DESCRIPTION OF THE PREFERRED EMBODIMENTS

EMBODIMENT 1

Hereinafter, a semiconductor device according to the first embodiment of the present invention will be described with reference to FIGS. 1 through 3.

Figure 1:
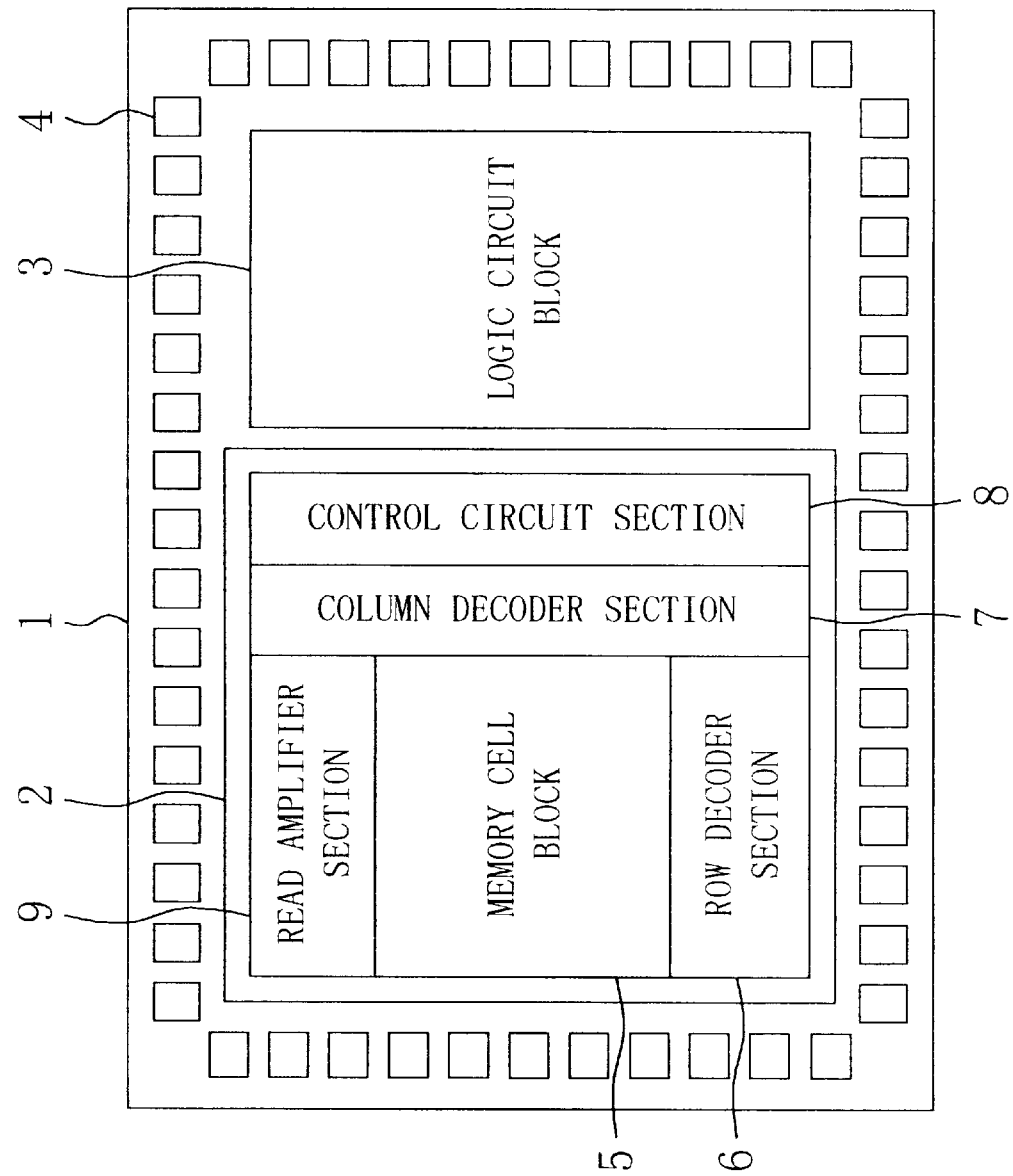
FIG. 1 is a plan view illustrating an overall arrangement for a semiconductor device according to a first embodiment.

FIG. 1 illustrates an overall arrangement for the semiconductor device 1 according to the first embodiment. As shown in FIG. 1, the semiconductor device 1 includes: a DRAM block 2 implemented as a memory section; a logic circuit block 3, made up of CMOS circuits and implemented as a logic section; and a great number of pad sections 4 disposed around the periphery of a substrate.

The DRAM block 2 includes: a memory cell block 5 including a plurality of sense amplifier circuits; a row decoder section 6; a column decoder section 7; a control circuit section 8; and a read amplifier section 9. Though not shown in FIG. 1, the DRAM block 2 is electrically connected to the logic circuit block 3 and to the pad sections 4 based on predetermined specifications.

Figure 2:
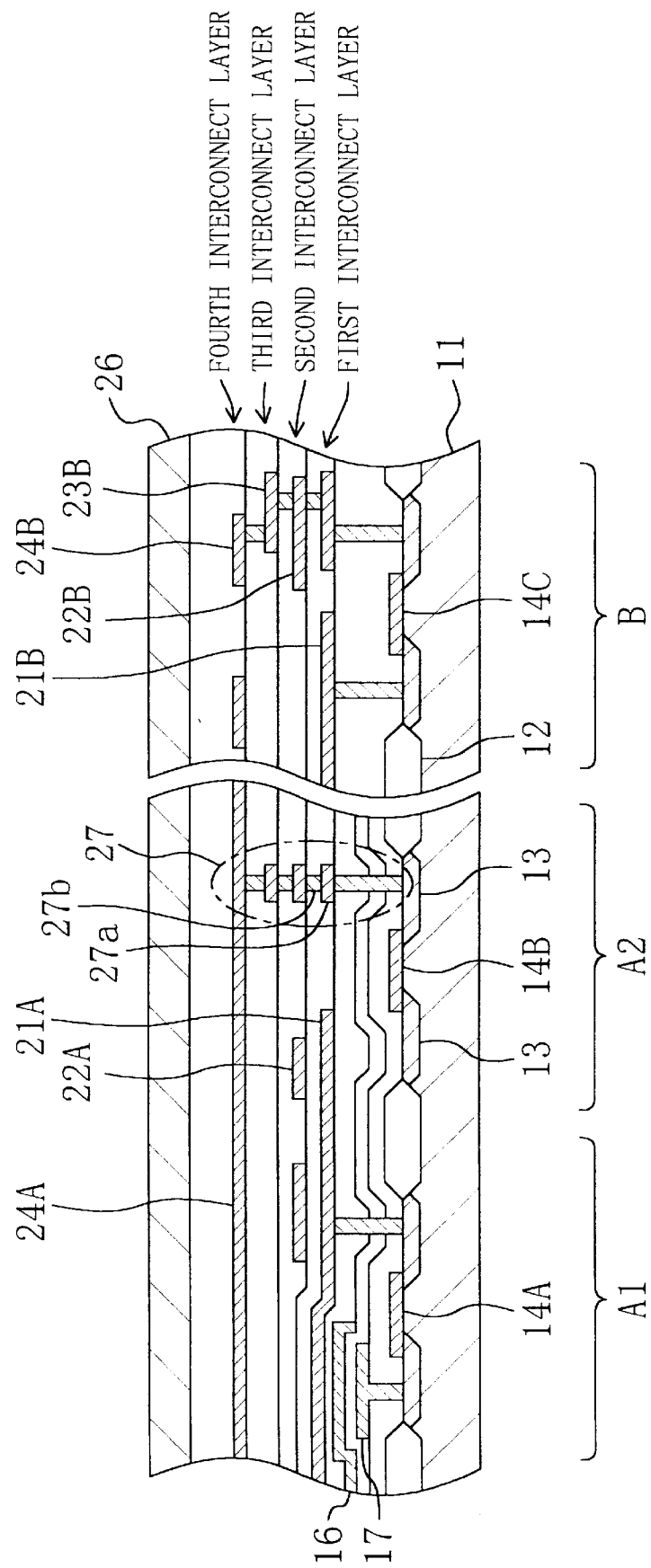
FIG. 2 is a cross-sectional view of the semiconductor device of the first embodiment.

FIG. 2 illustrates a cross-sectional structure of the semiconductor device of the first embodiment. In FIG. 2, A1 denotes a memory cell array region of the DRAM block 2 where a plurality of memory cells are arranged in a matrix fashion, i.e., in columns and rows. A2 denotes a sense amplifier region of the DRAM block 2 where transistors for amplifying and latching the data in a memory cell selected responsive to an address signal are provided. And B denotes a region where the logic circuit block 3 is provided.

As shown in FIG. 2, isolating regions 12 are formed on the semiconductor substrate 11 and an impurity diffused layer 13 is formed in respective regions surrounded by the isolating regions 12 on the semiconductor substrate 11. A first gate electrode 14A functioning as a word line of the DRAM is provided in the memory cell array region A1. A second gate electrode 14B constituting an n-channel transistor of the sense amplifier driver circuit is provided for the sense amplifier region A2. And a third gate electrode 14C constituting a transistor for the logic circuit is provided for the logic circuit block region B. A cell plate 16 and a storage node 17 constituting a memory cell of a stacked DRAM are placed in the memory cell array region A1.

Each of first, second, third and fourth interconnect layers is made of aluminum. In the first interconnect layer, a bit line 21A is formed in the memory cell array region A1 and a first logic interconnect 21B is formed in the logic circuit block region B. In the second interconnect layer, a memory interconnect 22A is formed in the memory cell array and sense amplifier regions A1, A2, and a second logic interconnect 22B is formed in the logic circuit block region B. In the third interconnect layer, a third logic interconnect 23B is formed in the logic circuit block region B. In the fourth interconnect layer, a metal layer 24A is formed to cover the memory cell array and sense amplifier regions A1, A2 of the DRAM block 2, and a fourth logic interconnect 24B is formed in the logic circuit block region B. A resin package 26 is provided over the fourth interconnect layer so as to cover the entire surface of the semiconductor substrate.

A group 27 of contacts for connecting upper-level interconnects to lower-level interconnects includes: cell patterns 27a electrically independent of (i.e., not electrically connected to) the memory and logic interconnects formed in the first to third interconnect layers; and contacts 27b interconnecting the upper and lower cell patterns 27a. These patterns 27a and contacts 27b are automatically routed by means of CAD.

Though not shown in FIG. 2, the first gate electrode 14A to be the word line of the DRAM block 2 is connected in parallel to the memory interconnect 22A at a predetermined position, thereby reducing effective wiring resistance.

Figure 3:
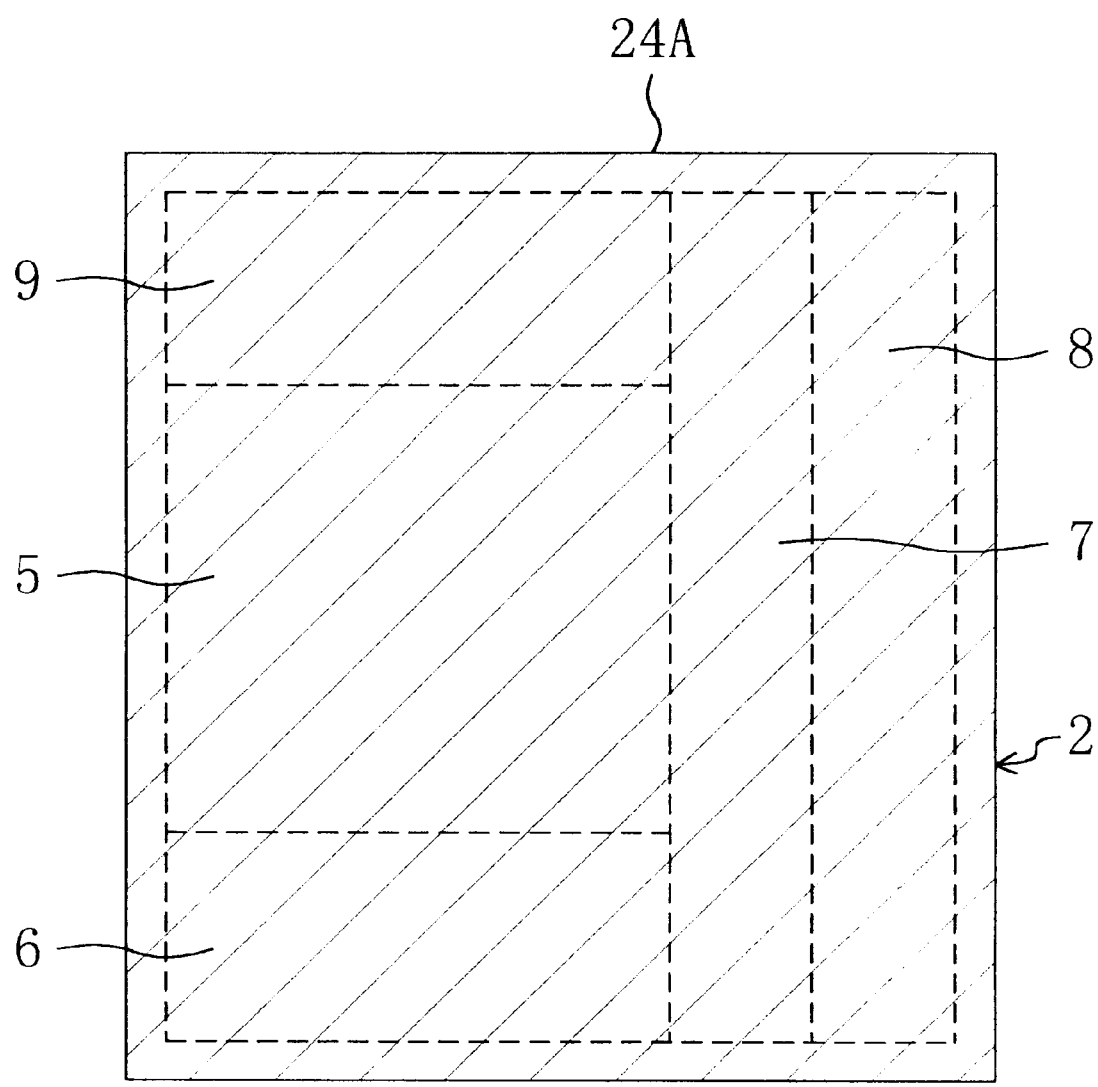
FIG. 3 is a plan view of a metal layer in the first embodiment.

The first embodiment is characterized in that the metal layer 24A is formed in the fourth interconnect layer to entirely cover the DRAM block 2 consisting of the memory cell block 5, the row decoder section 6, the column decoder section 7, the control circuit section 8 and the read amplifier section 9 as shown in FIG. 3. And this embodiment is also characterized in that the metal layer 24A is connected to a ground level.

Furthermore, as shown in FIG. 2, the metal layer 24A is electrically connected, through the group 27 of contacts, to the impurity diffused layer 13 to be the source region of the n-channel transistor of the sense amplifier driver circuit in the sense amplifier region A2.

Accordingly, the metal layer 24A can supply a stable ground level to the source region of the n-channel transistor of the sense amplifier driver circuit through the group 27 of contacts.

Also, since the metal layer 24 is formed to cover the DRAM block 2 entirely, the energy of alpha rays incoming from the outside of the semiconductor device 1 or from the resin package 26 toward the surface of the semiconductor substrate 11 is attenuated by the metal layer 24. As a result, soft errors are generated in the DRAM block 2 a considerably smaller number of times.

Moreover, since the metal layer 24 is electrically conductive, the layer 24A totally cuts off an electromagnetic wave at the surface thereof. Accordingly, this configuration is effectively applicable to the prevention of electromagnetic interference (EMI) resulting from the noise caused in an upper-level interconnect layer over the metal layer 24A.

Generally speaking, the DRAM block 2 requires a smaller number of interconnect layers than the logic circuit block 3. Thus, even if the metal layer 24A is provided for the fourth interconnect layer, the interconnects in the DRAM block 2 can be placed without any problem. That is to say, interconnects are provided for the four (i.e., first to fourth) interconnect layers in the logic circuit block 3, whereas interconnects are provided for the fewer number of (i.e., two or first and second) interconnect layers in the DRAM block 2. Even then, there is no inconvenience to the placement of the interconnects in the DRAM block 2. Accordingly, the metal layer 24A may be formed, for example, in the fourth interconnect layer, where no interconnects are provided for the DRAM block 2. Thus, there is no need to newly provide an additional interconnect layer for the metal layer 24A.

The metal layer 24A is connected to the ground level. Accordingly, a ground line for supplying a ground potential does not have to be provided separately.

The metal layer 24A covers the DRAM block 2 entirely. Thus, in automatically placing contacts 27b of the group 27 by CAD in view of the connection information of cell patterns 27a in lower-level interconnect layers, contacts 27b in upper-level interconnect layers can be automatically placed based on only the information of contacts 27b in lower-level interconnect layers. Accordingly, there is no need to overly extend a ground line, and the ground level supplied can be stabilized. As a result, it is easier to design desired interconnection. Also, even when contacts 27b are manually placed, contacts 27b in upper-level interconnect layers can be placed based on only the information of contacts 27b in lower-level interconnect layers by sequentially placing cell patterns 27a having the same shapes as the contacts 27b.

In the first embodiment, the metal layer 24 is electrically connected to the impurity diffused layer 13 to be the source region of the n-channel transistor of the sense amplifier driver circuit. Alternatively or additionally, the metal layer 24A may be connected to the grounded terminals of peripheral circuits provided for the DRAM block 2. In such a case, a stable ground potential can be supplied to the peripheral circuits formed in the DRAM block 2.

MODIFIED EXAMPLE 1 OF EMBODIMENT 1

Figure 4:
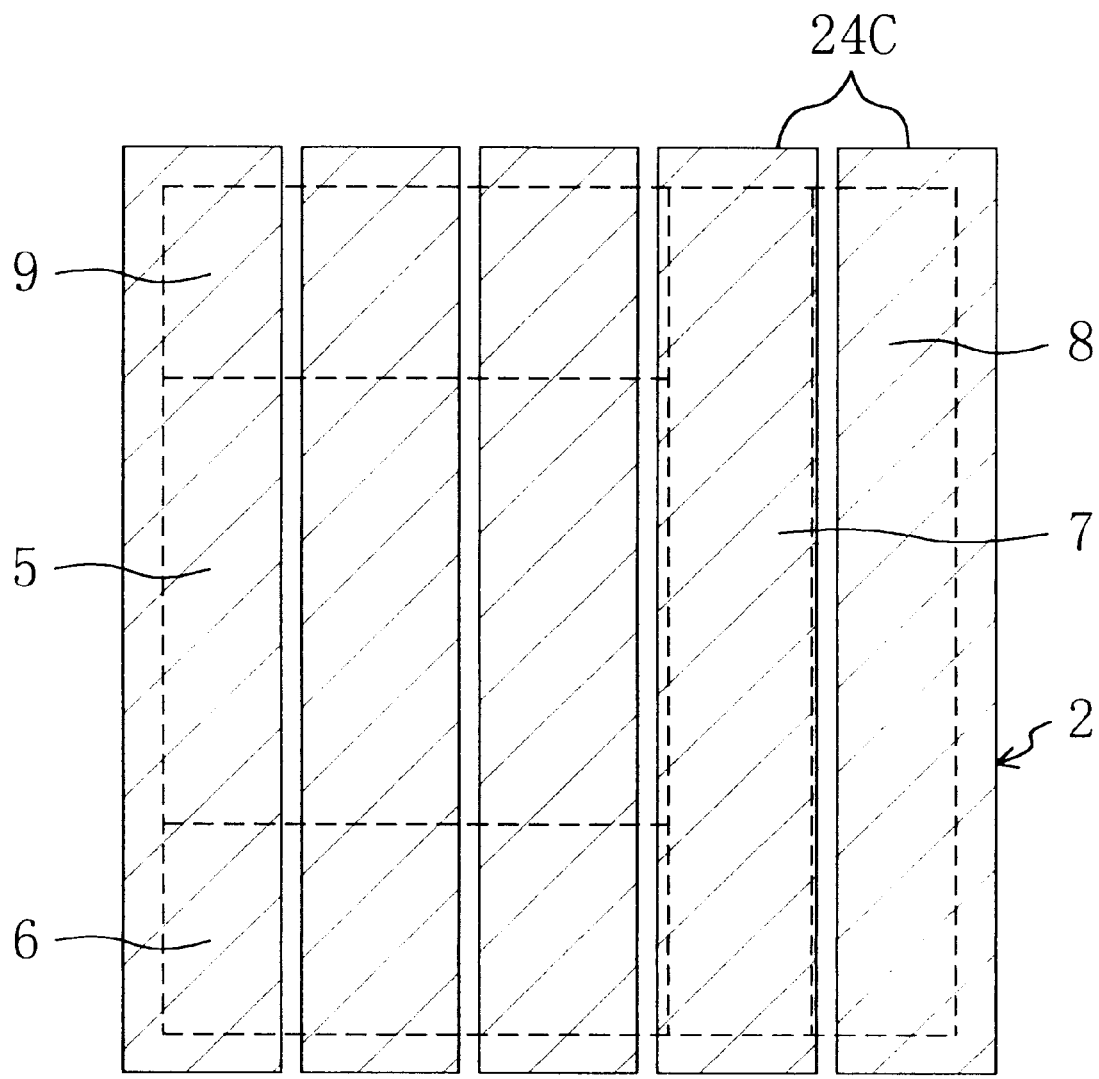
FIG. 4 is a plan view of a metal layer in a first modified example of the first embodiment.

FIG. 4 illustrates a planar structure of a metal layer in a first modified example of the first embodiment. The metal layer 24C of this modified example covers the DRAM block 2 almost entirely, but consists of a plurality of mutually divided metal layer partitions. And gaps are formed between the respective divided metal layer partitions to extend in the direction parallel to word lines provided for the memory cell block 5.

The metal layer 24C of this first modified example consists of a plurality of divided metal layer partitions. Thus, compared with providing a single continuous metal layer 24A as in the first embodiment, an interlevel stress, caused between the metal layer and an upper- or lower-level adjacent interlevel dielectric film due to a difference in thermal expansion coefficient therebetween, can be reduced. As a result, the generation of stress migration between adjacent interconnect layers can be suppressed.

MODIFIED EXAMPLE 2 OF EMBODIMENT 1

Figure 5:
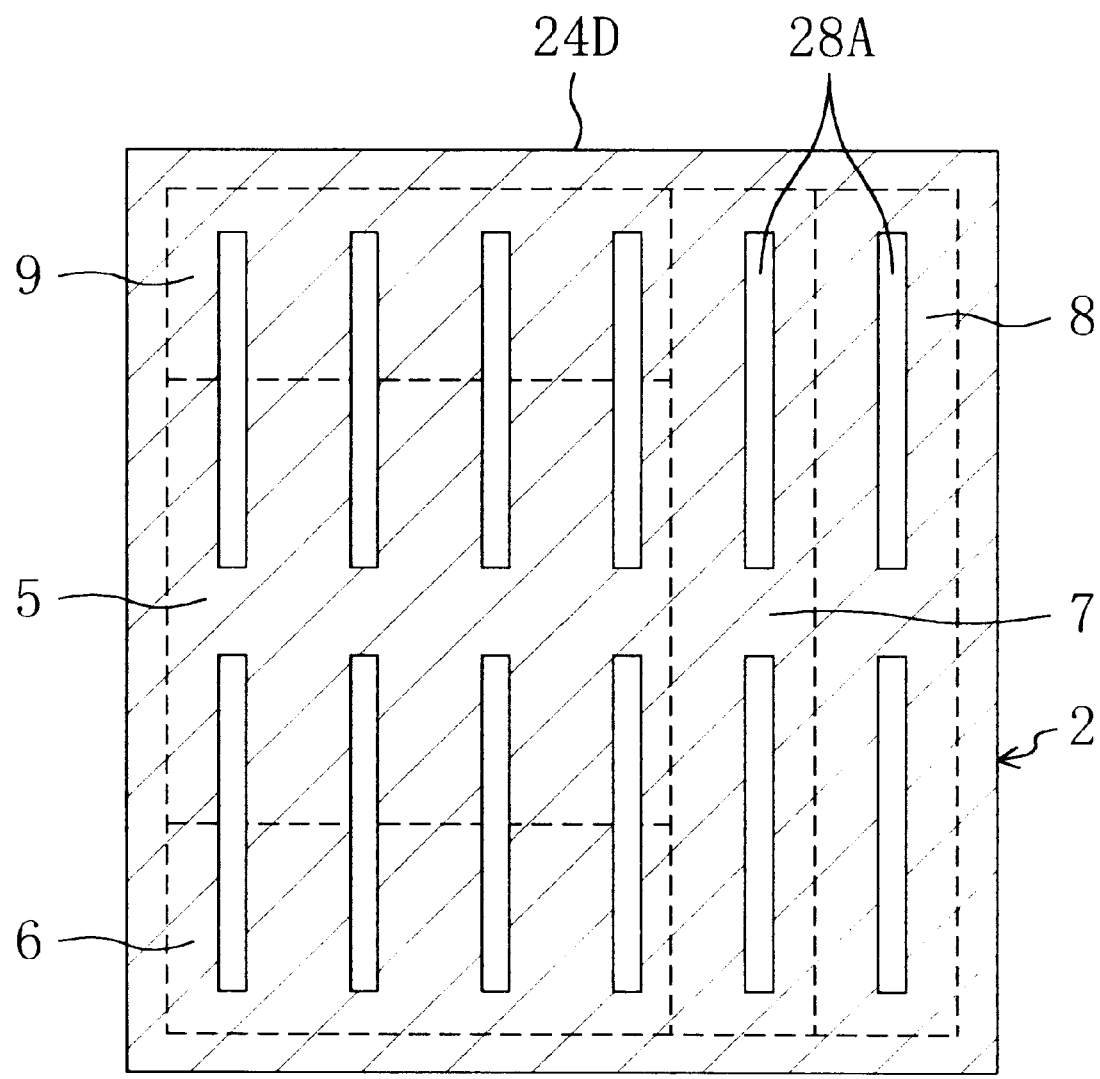
FIG. 5 is a plan view of a metal layer in a second modified example of the first embodiment.

FIG. 5 illustrates a planar structure of a metal layer in a second modified example of the first embodiment. The metal layer 24D of the second modified example constitutes a single layer as a whole. But the metal layer 24D is provided with a plurality of slit-like openings 28A extending in parallel to the word lines formed in the memory cell block 5.

The metal layer 24D of the second modified example is provided with a plurality of slits 28A. Thus, compared with providing a continuous metal layer 24A as in the first embodiment, the interlevel stress can be reduced. As a result, the generation of stress migration between adjacent interconnect layers can be suppressed.

MODIFIED EXAMPLE 3 OF EMBODIMENT 1

Figure 6:
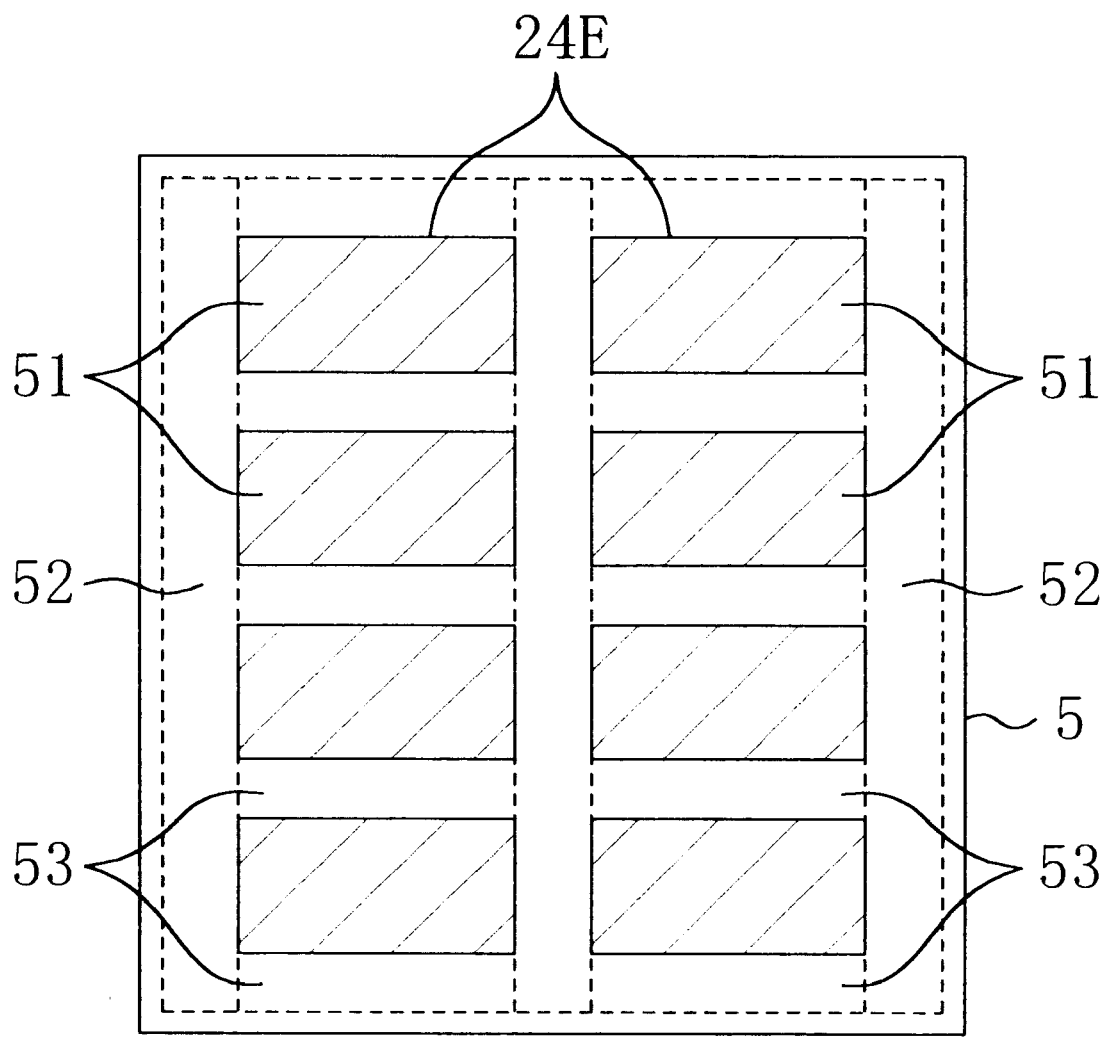
FIG. 6 is a plan view of a metal layer in a third modified example of the first embodiment.

FIG. 6 illustrates a planar structure of a metal layer in a third modified example of the first embodiment. As shown in FIG. 6, the memory cell block 5 consists of: memory cell array regions 51; sense amplifier regions 52; and word line shunt regions 53 (where lines supplementing the word lines are provided for reducing the delay of the word lines). The metal layer 24E of the third modified example covers only the memory cell array regions 51 among these regions.

Since the metal layer 24E of this third modified examples covers only the memory cell array regions 51 of the memory cell block 5, the area of the metal layer 24E is smaller than that of the metal layer 24 of the first embodiment. Accordingly, the interlevel stress can be reduced, and the generation of stress migration between adjacent interconnect layers can be suppressed.

Stated otherwise, the memory cell array regions 51, where soft errors are particularly likely to be generated upon the incidence of alpha rays, are covered with the metal layer 24E in this third modified example. Thus, the generation of soft errors can be suppressed.

MODIFIED EXAMPLE 4 OF EMBODIMENT 1

Figure 7:
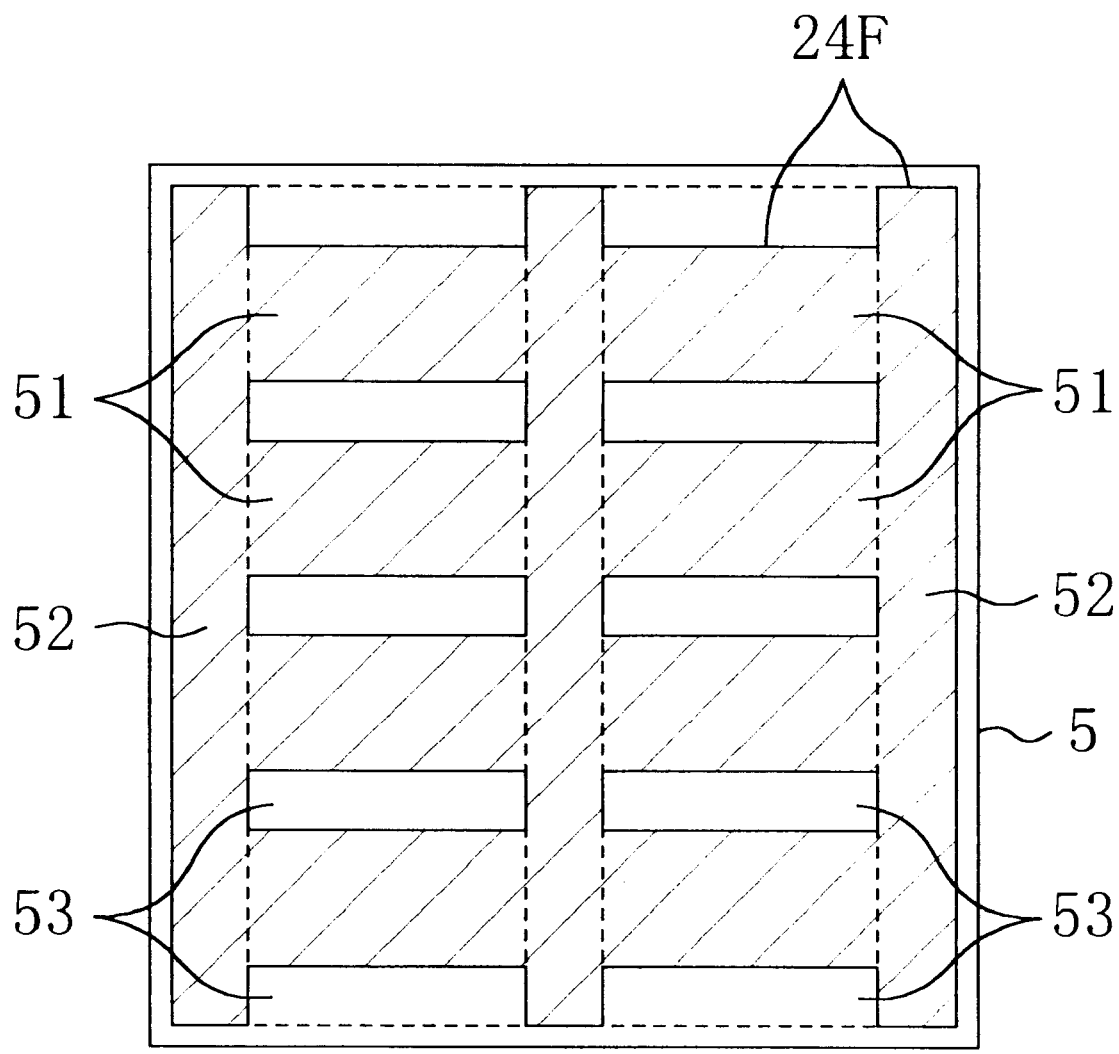
FIG. 7 is a plan view of a metal layer in a fourth modified example of the first embodiment.

FIG. 7 illustrates a planar structure of a metal layer in a fourth modified example of the first embodiment. As shown in FIG. 7, the memory cell block 5 consists of: memory cell array regions 51; sense amplifier regions 52; and word line shunt regions 53. The metal layer 24F of the fourth modified example covers the memory cell array regions 51 and the sense amplifier regions 52 among these regions.

Since the metal layer 24F of this fourth modified examples covers only the memory cell array regions 51 and the sense amplifier regions 52 of the memory cell block 5, the area of the metal layer 24F is smaller than that of the metal layer 24 of the first embodiment. Accordingly, the interlevel stress can be reduced, and the generation of stress migration between adjacent interconnect layers can be suppressed.

In other words, the memory cell array regions 51 and the sense amplifier regions 52, where soft errors are particularly likely to be generated upon the incidence of alpha rays, are covered with the metal layer 24F in this fourth modified example. Thus, the generation of soft errors can be suppressed with more certainty.

EMBODIMENT 2

Hereinafter, a semiconductor device according to the second embodiment of the present invention will be described with reference to FIGS. 8 to 10.

Figure 8:
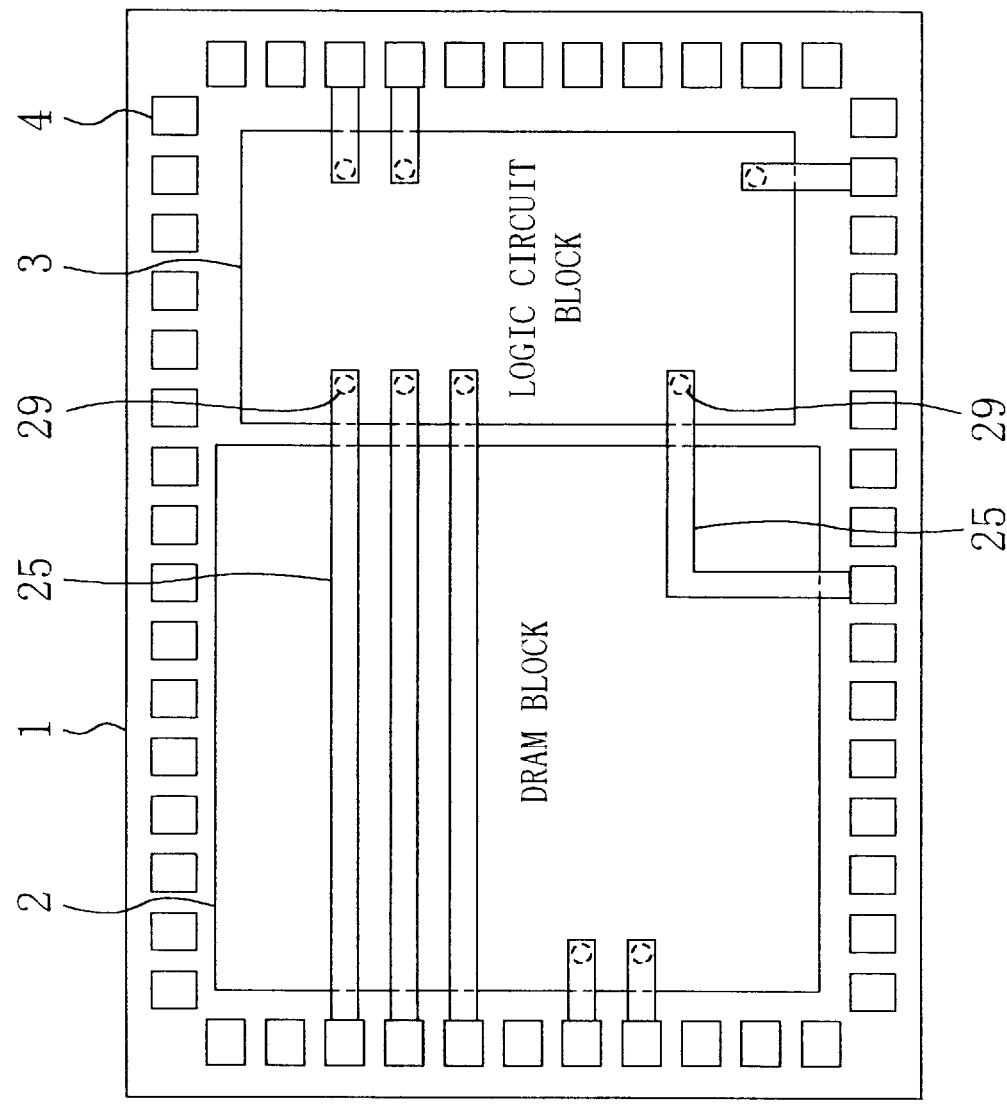
FIG. 8 is a plan view of a fifth interconnect layer in a second embodiment.

FIG. 8 illustrates a planar structure of a fifth interconnect layer (i.e., uppermost interconnect layer) of the semiconductor device 1 in the second embodiment. FIG. 9 illustrates a planar structure of a fourth interconnect layer of the semiconductor device 1 in the second embodiment. As in the first embodiment, the semiconductor device 1 of the second embodiment also includes: a DRAM block 2 implemented as a memory section; a logic circuit block 3, made up of CMOS circuits and implemented as a logic section; and a large number of pad sections 4 disposed around the periphery of a substrate.

Figure 10:
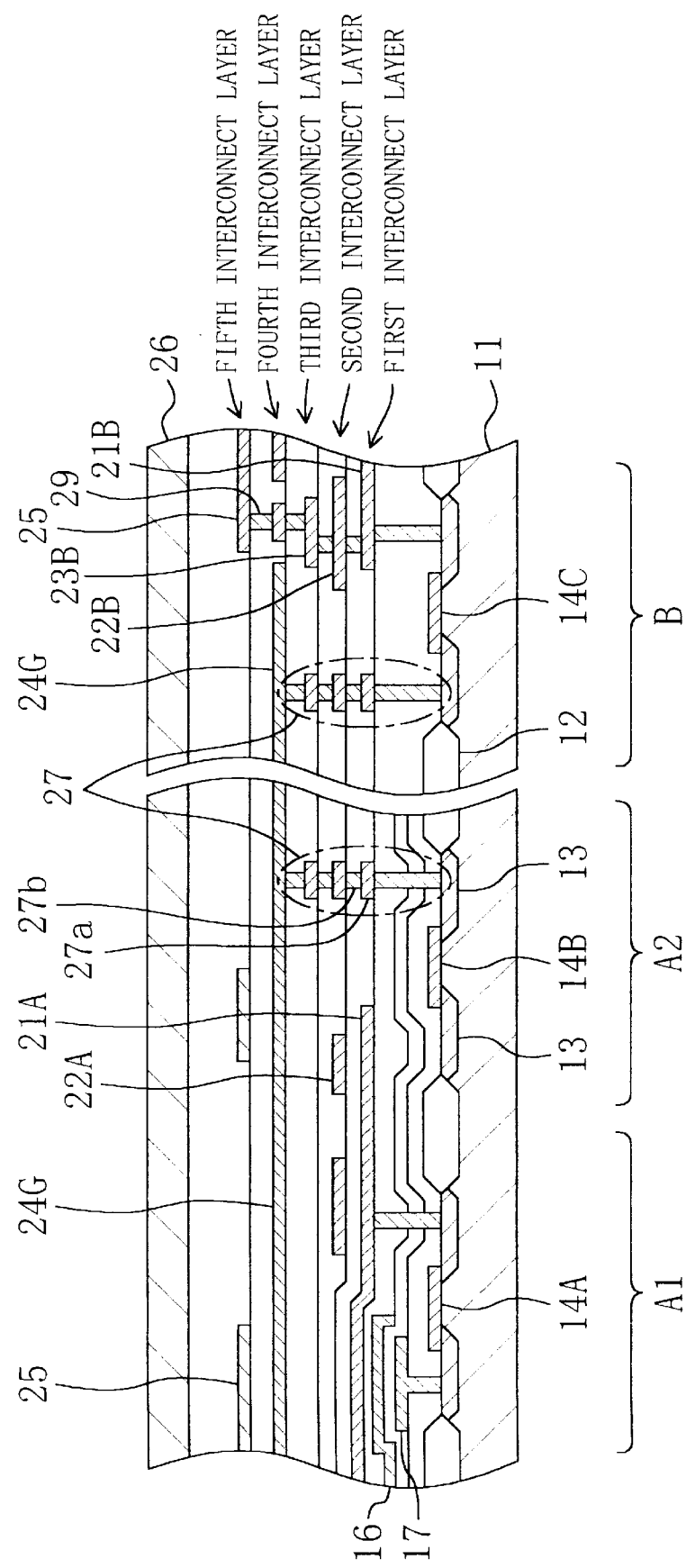
FIG. 10 is a cross-sectional view of a semiconductor device according to the second embodiment.

FIG. 10 illustrates a cross-sectional structure of the semiconductor device 1 of the second embodiment. In FIG. 10, A1 denotes a memory cell array region of the DRAM block 2; A2 denotes a sense amplifier region of the DRAM block 2; and B denotes a region where the logic circuit block 3 is provided.

As shown in FIG. 10, isolating regions 12 are formed on the semiconductor substrate 11 and an impurity diffused layer 13 is formed in respective regions surrounded by the isolating regions 12 on the semiconductor substrate 11. A first gate electrode 14A functioning as a word line of the DRAM is provided in the memory cell array region A1. A second gate electrode 14B constituting an n-channel transistor of the sense amplifier driver circuit is provided for the sense amplifier region A2. And a third gate electrode 14C constituting a transistor for the logic circuit is provided for the logic circuit block region B. A cell plate 16 and a storage node 17 constituting a memory cell of a stacked DRAM are placed in the memory cell array region A1.

Each of first, second, third, fourth and fifth interconnect layers is made of aluminum. In the first interconnect layer, a bit line 21A is formed in the memory cell array region A1 and a first logic interconnect 21B is formed in the logic circuit block region B. In the second interconnect layer, a memory interconnect 22A is formed in the memory cell array and sense amplifier regions A1, A2, and a second logic interconnect 22B is formed in the logic circuit block region B. In the third interconnect layer, a third logic interconnect 23B is formed in the logic circuit block region B. A resin package 26 is provided over the fifth interconnect layer to cover the entire surface of the semiconductor substrate 11.

Figure 9:
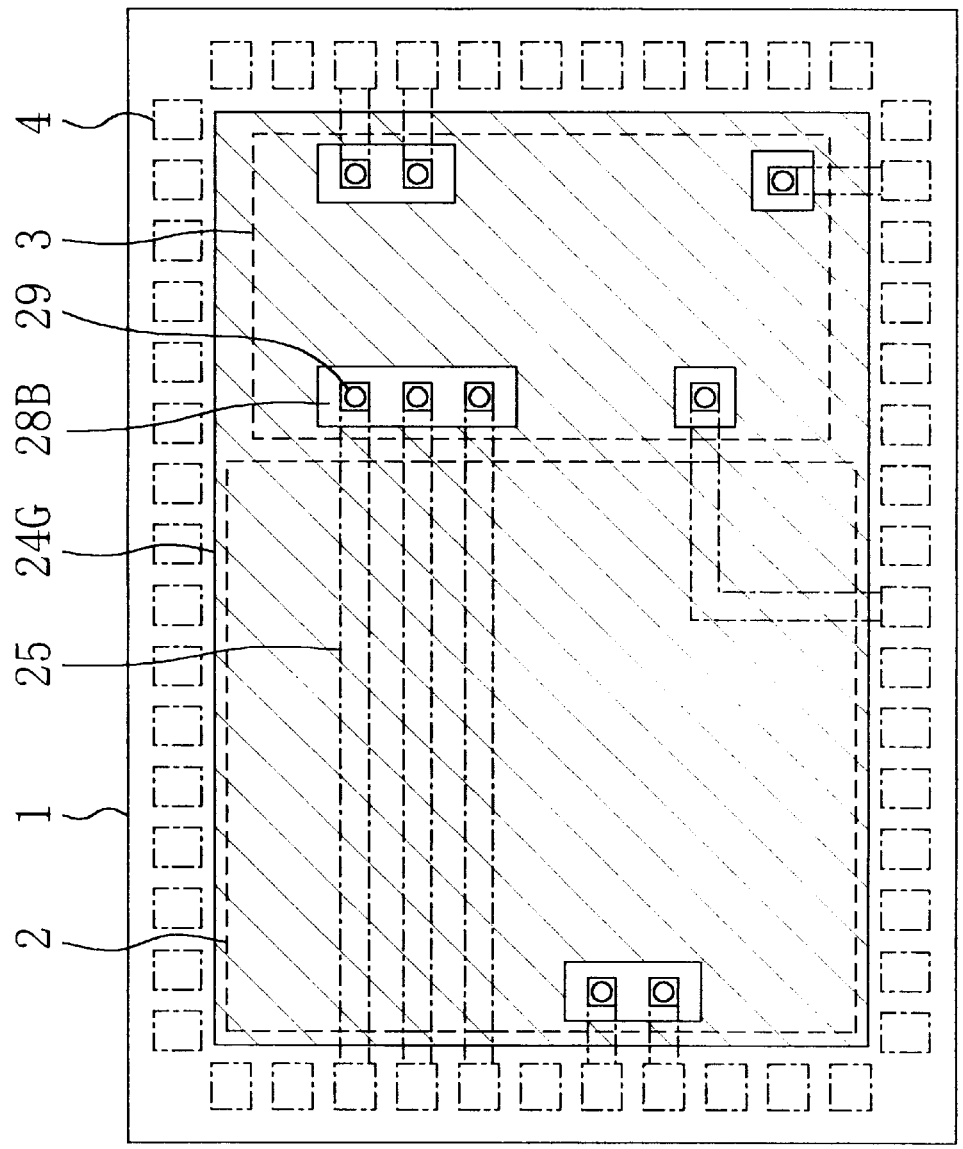
FIG. 9 is a plan view of a fourth interconnect layer in the second embodiment

The second embodiment is characterized in that in the fourth interconnect layer, a metal layer 24G is formed to cover the memory cell array and sense amplifier regions A1, A2 of the DRAM block 2 and the logic circuit block region B almost entirely as shown in FIGS. 9 and 10.

As shown in FIG. 10, the metal layer 24G is electrically connected, through groups 27 of contacts, to respective parts of the impurity diffused layer 13 to be the source regions of the n-channel transistors of the sense amplifier a driver circuit provided in the sense amplifier region A2 and the logic circuit.

Accordingly, the metal layer 24G can supply a stable ground potential to the source regions of respective n-channel transistors of the sense amplifier driver circuit and the logic circuit through the groups 27 of contacts.

The second embodiment is also characterized in that in the fifth interconnect layer, metal interconnects 25 for connecting the pad sections 4 formed in the fifth interconnect layer to the DRAM block 2 or the logic circuit block 3 are provided as shown in FIGS. 8 and 9.

The metal interconnects 25 are connected to the third logic interconnects 23B through contacts 29. Accordingly, openings 28B are formed in the metal layer 24G provided in the fourth interconnect layer at respective sites that the contacts 29 pass. Thus, the metal layer 24G is not connected to either the metal interconnects 25 or the third logic interconnects 23B.

In the second embodiment, the metal layer 24G is provided to cover the DRAM block 2 and the logic circuit block 3 almost entirely. Accordingly, the energy of alpha rays incoming from the outside of the semiconductor device 1 or from the resin package 26 toward the surface of the semiconductor substrate 11 is attenuated by the metal layer 24G. As a result, soft errors are generated a considerably smaller number of times.

Also, in this embodiment, interconnects are provided for the three (i.e., first to third) interconnect layers in the logic circuit block 3, whereas interconnects are provided for the fewer number of (i.e., two or first and second) interconnect layers in the DRAM block 2. Even then, there is no inconvenience to the placement of interconnects in the DRAM block 2.

The metal layer 24G is connected to the ground level. Accordingly, a ground line for supplying a ground potential does not have to be provided separately.

The metal layer 24A is provided to cover the DRAM block 2 and the logic circuit block 3 almost entirely. Thus, contacts 27b in upper-level interconnect layers can be placed based on only the information of contacts 27b in lower-level interconnect layers.

Accordingly, in the second embodiment, interconnection can be designed to realize a stabilized ground level in both the DRAM and logic circuit blocks 2, 3. In particular, since the variation in ground level of circuits performing an analog operation can be directly suppressed according to this second embodiment, the operation can be further stabilized.

In the second embodiment, the bit line 21A, easily susceptible to even weak noise, in the memory cell block 5 is in a coupling relationship with the metal interconnects 25 to be an indirect source of generating some noise. However, the metal layer 24G, which is fixed at the ground node and has a large capacitance, is interposed between the bit line 21A in the memory cell block 5 and the metal interconnects 25. Accordingly, even if the level of a signal voltage transmitted to the metal interconnects 25 abruptly changes, the bit line 21A in the memory cell block 5 is hardly affected by the coupling noise. That is to say, the bit line 21A in the memory cell block 5 can be protected from the adverse effects of the noise generated from the metal interconnects 25 with much more certainty. Accordingly, the interconnect regions, overlying the DRAM block 2 occupying almost a half of the entire area of a semiconductor device having memory and logic sections integrated on a single semiconductor chip, can be fully taken advantage of. In addition, interconnects can be freely placed in the DRAM and logic circuit blocks 2, 3 by means of CAD.

Moreover, since the metal layer 24G is electrically conductive, the layer 24G totally cuts off an electromagnetic wave. Accordingly, even when the logic circuit block 3 operates at a high speed, the metal layer 24G can prevent the electromagnetic wave noise, caused by the logic circuit block 3, from bringing about EMI.

MODIFIED EXAMPLE 1 OF EMBODIMENT 2

Figure 11:
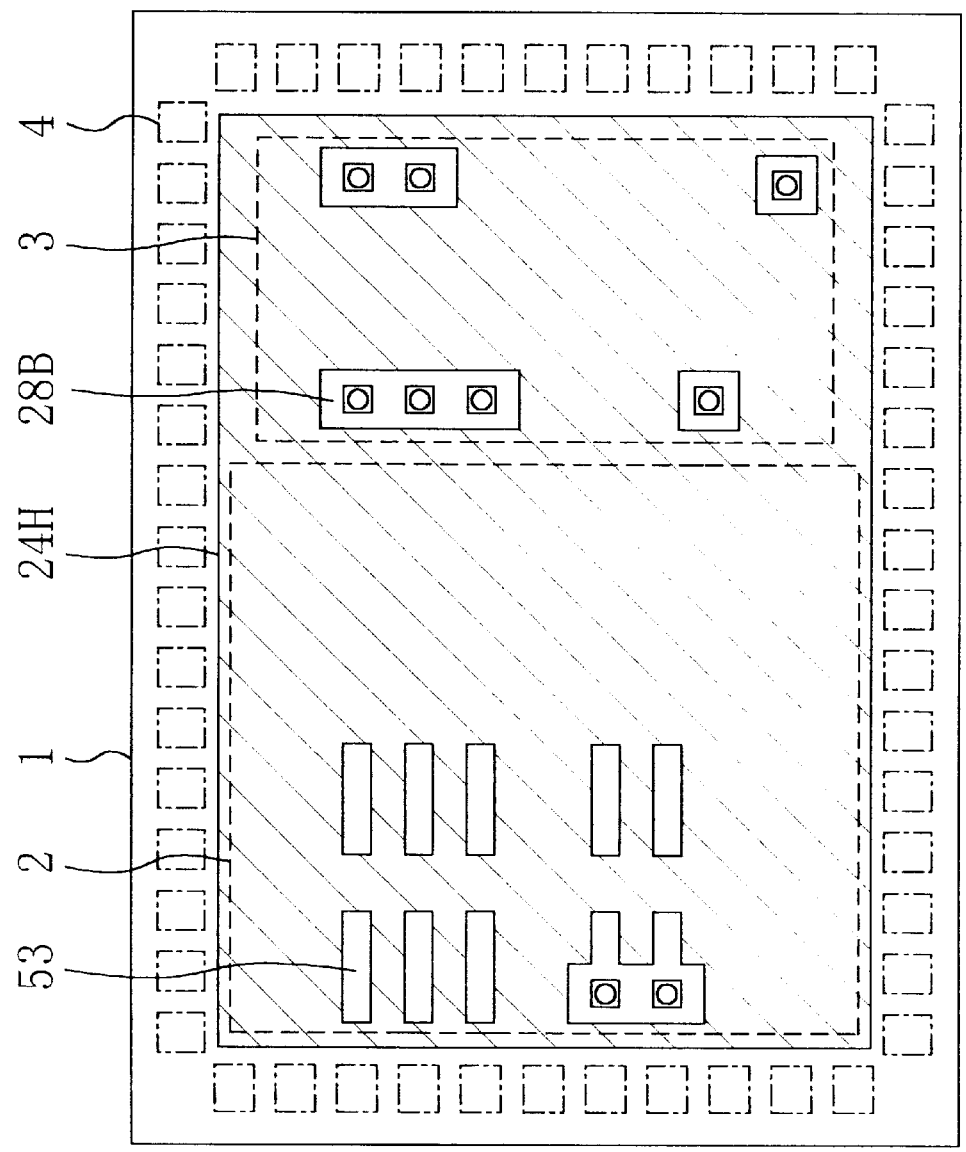
FIG. 11 is a plan view of a fourth interconnect layer in a modified example of the second embodiment.

FIG. 11 illustrates a planar structure of a metal layer in a modified example of the second embodiment. The metal layer 24H of this modified example is provided with openings 28A at both the sites that the contacts 29 pass and the sites corresponding to the word line shunt regions 53 in the memory cell block 5.

Accordingly, compared with the second embodiment, the interlevel stress can be further reduced, and the generation of stress migration between adjacent interconnects can be suppressed with more certainty.

When a metal layer is provided to cover both the DRAM and logic circuit blocks 2, 3 as in the second embodiment, the metal layer over the logic circuit block 3 may be divided into a plurality of partitions with gaps interposed therebetween as shown in FIG. 4 or may have slit-like openings as shown in FIG. 5 when viewed from above.

In the first and second embodiments, the metal layer is connected to the ground level. Alternatively, the metal layer may be connected to a power supply voltage supplied from the outside of the semiconductor device 1 or to a predetermined internal voltage generated inside the device based on the power supply voltage. Since the metal layer has a large area, the capacitance thereof is also large and the potential level hardly varies. Accordingly, even when the metal layer is connected to a power supply voltage or an internal voltage, a stable power supply voltage level or internal voltage level can be supplied.

Each of the first to fourth interconnect layers of the first embodiment and the first to fifth interconnect layers of the second embodiment is made of aluminum. Alternatively, each layer may be made of an alloy of aluminum and any other metal such as silicon or copper, or made of any other metal.

In the first embodiment, four (i.e., first to fourth) interconnect layers are provided, while five (i.e., first to fifth) interconnect layers are provided in the second embodiment. However, the number of interconnect layers is not particularly limited according to the present invention.

The interconnects for the logic circuit block 3 are provided in the first to fourth interconnect layers according to the first embodiment, and in the first to third interconnect layers according to the second embodiment. And the interconnects for the DRAM block 2 are provided in the first and second interconnect layers according to both the first and second embodiments. However, the numbers of these layers are also nothing but exemplary ones. Any numbers may be arbitrarily selected so long as the number of interconnect layers where interconnects for the DRAM block 2 are formed is smaller than the number of interconnect layers where interconnects for the logic circuit block 3 are formed.

Accordingly, if the number of interconnect layers where interconnects for the DRAM block 2 are formed is denoted by n (where n is a positive integer), the number of interconnect layers where interconnects for the logic circuit block 3 are formed may be n+m (where m is also a positive integer).

In the first and second embodiments, the memory section is implemented as a DRAM block 2. Alternatively, the memory section may include SRAM's or flash memories having a floating gate.

In the foregoing embodiments, the logic section is implemented as a logic circuit block 3 made up of CMOS circuits. Alternatively, the logic section may be a gate array of CMOS's or bi-CMOS's.

What is claimed is:

1. A semiconductor device comprising:

a semiconductor chip;

a memory section, which is formed on the semiconductor chip and includes an array of memory cells, a sense amplifier circuit, and memory interconnects respectively provided in a number n (where n is a positive integer) of interconnect layers;

a logic section, which is formed on the semiconductor chip and includes logic circuits having logic interconnects respectively provided in a number n+m (where m is a positive integer) of interconnect layers; and a metal layer, which is formed in one of (n+1)th to (n+m)th interconnect layers and covers the array of memory cells, wherein the metal layer supplies a predetermined potential to the memory section.

2. The device of claim 1, wherein the metal layer covers the array of memory cells and the sense amplifier circuit.

3. The device of claim 1, wherein the metal layer covers the memory section.

4. The device of claim 1, wherein the metal layer has an opening.

5. The device of claim 1, wherein the memory section is a DRAM.

6. The device of claim 5, wherein the metal layer supplies the predetermined potential to a sense amplifier driver circuit for driving the sense amplifier circuit.

7. The device of claim 1, further comprising a metal interconnect, which is formed in an interconnect layer overlying the (n+m)th interconnect layer and one terminal of which is connected to a pad, wherein the other terminal of the metal interconnect is connected to at least one of the memory and logic interconnects through a contact.

* * * * *